US010214808B2

(12) United States Patent
Huh et al.

(10) Patent No.: US 10,214,808 B2
(45) Date of Patent: Feb. 26, 2019

(54) DEPOSITION APPARATUS

(71) Applicant: SAMSUNG DISPLAY CO., LTD., Yongin-si, Gyeonggi-do (KR)

(72) Inventors: Myung-Soo Huh, Yongin-si (KR); Suk-Won Jung, Yongin-si (KR); Jeong-Ho Yi, Yongin-si (KR); Sang-Hyuk Hong, Yongin-si (KR); Yong-Suk Lee, Yongin-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 15/492,941

(22) Filed: Apr. 20, 2017

(65) Prior Publication Data
US 2017/0218508 A1 Aug. 3, 2017

Related U.S. Application Data

(62) Division of application No. 14/020,849, filed on Sep. 8, 2013, now Pat. No. 9,673,265.

(30) Foreign Application Priority Data

Dec. 12, 2012 (KR) .................. 10-2012-0144673

(51) Int. Cl.
*H01L 27/00* (2006.01)
*C23C 16/04* (2006.01)
(Continued)

(52) U.S. Cl.
CPC ........ *C23C 16/042* (2013.01); *C23C 16/4405* (2013.01); *C23C 16/4585* (2013.01);
(Continued)

(58) Field of Classification Search
CPC .................................................. C23C 16/042
See application file for complete search history.

(56) References Cited

U.S. PATENT DOCUMENTS 6,553,932 B2   4/2003 Liu et al.
7,993,461 B2 * 8/2011 Endo .................. C23C 16/042
                                                 118/728

(Continued)

FOREIGN PATENT DOCUMENTS

CN         1766157 A       5/2006
CN       101228290 A       7/2008
(Continued)

OTHER PUBLICATIONS

Extended European Search Report dated Mar. 11, 2014 from EP 131934447.3-1353.

(Continued)

*Primary Examiner* — Robert A Vetere
(74) *Attorney, Agent, or Firm* — Lee & Morse, P.C.

(57) ABSTRACT

A deposition apparatus for performing a deposition process by using a mask with respect to a substrate, the deposition apparatus includes a chamber, a support unit in the chamber, the support unit including first holes and being configured to support the substrate, a supply unit configured to supply at least one deposition raw material toward the substrate, and movable alignment units through the first holes of the support unit, the alignment units being configured to support the mask and to align the mask with respect to the substrate.

19 Claims, 6 Drawing Sheets

(51) Int. Cl.
*C23C 16/458* (2006.01)
*H01L 21/68* (2006.01)
*H01L 27/32* (2006.01)
*H01L 21/687* (2006.01)
*C23C 16/44* (2006.01)
*C23C 16/50* (2006.01)
*C23C 16/52* (2006.01)
*H01L 51/00* (2006.01)
*H01L 51/56* (2006.01)

(52) U.S. Cl.
CPC ............. *C23C 16/50* (2013.01); *C23C 16/52* (2013.01); *H01L 21/681* (2013.01); *H01L 21/682* (2013.01); *H01L 21/68735* (2013.01); *H01L 21/68742* (2013.01); *H01L 27/3244* (2013.01); *H01L 51/0012* (2013.01); *H01L 51/56* (2013.01)

(56) References Cited

U.S. PATENT DOCUMENTS

| | | | |
|---|---|---|---|
| 8,617,314 B2 | 12/2013 | An et al. | |
| 2002/0078893 A1 | 6/2002 | Os et al. | |
| 2002/0103571 A1* | 8/2002 | Yoo | H01L 21/67796 700/228 |
| 2002/0182343 A1* | 12/2002 | Yuda | C23C 16/402 427/569 |
| 2003/0072881 A1* | 4/2003 | Yang | C23C 16/401 427/255.28 |
| 2003/0192568 A1* | 10/2003 | Zheng | B08B 7/00 134/1.1 |
| 2004/0001177 A1* | 1/2004 | Byun | G02F 1/1339 349/187 |
| 2006/0090705 A1 | 5/2006 | Kim | |
| 2009/0258142 A1* | 10/2009 | An | C23C 14/042 427/255.6 |
| 2010/0055318 A1 | 3/2010 | Volf et al. | |
| 2011/0236599 A1 | 9/2011 | Furuta et al. | |
| 2012/0006264 A1* | 1/2012 | Ukigaya | C03C 17/002 118/713 |
| 2014/0162385 A1 | 6/2014 | Huh et al. | |
| 2014/0170785 A1* | 6/2014 | Kurita | H01L 51/56 438/26 |

FOREIGN PATENT DOCUMENTS

| | | |
|---|---|---|
| CN | 203582967 U | 5/2014 |
| JP | 07-102372 A | 4/1995 |
| JP | H07-102372 A | 4/1995 |
| JP | 2010-248583 A | 11/2010 |
| KR | 10-2006-0048976 A | 5/2006 |
| KR | 10-2009-0108887 A | 10/2009 |
| KR | 10-2010-0115720 A | 10/2010 |
| KR | 10-2011-0042225 A | 4/2011 |
| KR | 10-2012-0078835 A | 7/2012 |
| WO | WO 2011/136075 A1 | 11/2011 |
| WO | WO-2011136075 A1 * | 11/2011 ........... C23C 16/042 |
| WO | WO 2012/173692 A1 | 12/2012 |

OTHER PUBLICATIONS

Chinese Office Action dated Apr. 20, 2017 in the examination of corresponding Chinese Patent Application No. 201310476177.4.
Chinese Office Action dated Nov. 9, 2017 in the examination of corresponding Chinese Patent Application No. 201310476177.4.
Japanese Office action dated Aug. 22, 2017 for the Japanese Patent Application No. 2013-256988.
European Office Action dated Mar. 21, 2017 in the examination of the European Patent Application No. 13193447.3.
Action dated Mar. 21, 2017 from corresponding EP Application 13 193 447.3-1373.

* cited by examiner

DEPOSITION APPARATUS

CROSS-REFERENCE TO RELATED APPLICATIONS

This is a divisional application based on pending application Ser. No. 14/020,849, filed Sep. 8, 2013, the entire contents of which is hereby incorporated by reference.

This application claims the benefit of Korean Patent Application No. 10-2012-0144673, filed on Dec. 12, 2012, in the Korean Intellectual Property Office, the disclosure of which is incorporated herein in its entirety by reference.

BACKGROUND

1. Field

Example embodiments relate to a deposition apparatus, a method of forming a thin film using the same, and a method of manufacturing an organic light-emitting display apparatus. More particularly, example embodiments relate to a deposition apparatus providing an efficient deposition procedure and a deposition film with improved characteristics, a method of forming a thin film using the same, and a method of manufacturing an organic light-emitting display apparatus.

2. Description of the Related Art

Semiconductor devices, display devices, and other electronic devices include a plurality of thin films. Various methods may be used to form the plurality of thin films, one of which is a deposition method.

The deposition method uses various raw materials, e.g., one or more gases, to form a thin film. The deposition method includes a chemical vapor deposition (CVD) method, an atomic layer deposition (ALD) method, and the like.

Among display apparatuses, an organic light-emitting display apparatus is expected to become a next generation display apparatus due to its wide viewing angles, high contrast, and fast response speeds. The conventional organic light-emitting display apparatus includes an intermediate layer having an organic emission layer between first and second electrodes which face each other, and also includes one or more various thin films. At this point, a deposition process is used to form a thin film of the organic light-emitting display apparatus.

SUMMARY

Example embodiments provide a deposition apparatus which may be used to efficiently perform a deposition process and to easily improve a characteristic of a deposition film, a method of manufacturing a thin film using the deposition apparatus, and a method of manufacturing an organic light-emitting display apparatus.

According to an aspect of the example embodiments, there is provided a deposition apparatus for performing a deposition process by using a mask with respect to a substrate, the deposition apparatus including a chamber, a support unit in the chamber, the support unit including first holes and being configured to support the substrate, a supply unit configured to supply at least one deposition raw material toward the substrate, and movable alignment units through the first holes of the support unit, the alignment units being configured to support the mask and to align the mask with respect to the substrate.

The deposition apparatus may further include alignment confirmation members configured to confirm an alignment state of the substrate and the mask through second holes in the support unit.

The alignment confirmation members may be configured to check alignment of an alignment mark on the substrate and an alignment mark on the mask to confirm the alignment state of the substrate and the mask.

The second holes in the support unit may be closer to a center region of the support unit than the first holes.

The alignment confirmation members may be farther from the supply unit than the support unit.

The support unit may be between the alignment confirmation members and the supply unit.

The chamber may include transparent windows overlapping the second holes, the alignment confirmation members being configured to confirm the alignment state of the substrate and the mask through the transparent windows.

A cross-sectional area of the alignment units may be smaller than a size of the first holes, the alignment units being movable in three dimensions inside the first holes.

The alignment units may be configured to move vertically and horizontally within the first hole while supporting the mask.

An upper surface of the support unit may be curved.

A center region of the upper surface of the support unit may protrude upward relative to end regions of the upper surface of the support unit.

A lower surface of the support unit is curved in accordance with a curvature of the upper surface of the support unit.

A lower surface of the support unit may be flat.

The deposition apparatus may further include lift pins through third holes in the support unit, the lift pins being configured to support the substrate and to move vertically in the third holes to dispose the substrate onto the support unit.

The third holes may be closer to a center region of the support unit than the first holes.

The deposition apparatus may further include a base plate configured to support the supply unit, the base plate being positioned farther from the support unit than the supply unit.

The deposition apparatus may further include a power unit configured to apply voltage between the supply unit and the support unit to generate plasma.

The deposition apparatus may further include a cleaning unit configured to generate plasma and to insert the plasma into the chamber to clean inside of the chamber.

The support unit may be movable along a normal thereto.

The chamber may include at least one doorway, the substrate or the mask being inserted to the chamber through the at least one doorway.

According to another aspect of the example embodiments, there is provided a method of forming a thin film on a substrate by using a deposition apparatus, wherein the method includes inserting the substrate into a chamber, disposing the substrate on a support unit, the support unit including first holes, aligning a mask with respect to the substrate by moving alignment units, the alignment units extending through the first holes of the support unit to support the mask, and supplying at least one deposition raw material toward the substrate to form the thin film on the substrate.

Aligning the mask with respect to the substrate may include confirming an alignment state of the substrate and the mask by using in real-time alignment confirmation members through second holes in the support unit.

Using the alignment confirmation members may include checking an alignment mark of each of the mask and the substrate.

Aligning the mask with respect to the substrate may include moving lift pins toward the support unit, while supporting the substrate, the lift pins penetrating through third holes in the support unit.

The method may further include controlling a distance between the substrate and the supply unit by vertically moving the support unit up and down, after the aligning of the mask with respect to the substrate.

The method may further include cleaning of the chamber by generating a remote plasma from a cleaning unit connected to the chamber, and inserting the remote plasma to the chamber after forming the thin film layer.

According to another aspect of the example embodiments, there is provided a method of manufacturing an organic light-emitting display apparatus, the method including inserting a substrate into a chamber, disposing the substrate on a support unit, the support unit including first holes, aligning a mask with respect to the substrate by using alignment units disposed to penetrate the first holes of the support unit while supporting the mask, and supplying from a supply unit one or more deposition raw materials toward the substrate, such that at least one thin film of an organic light emitting element is formed on the substrate.

Aligning the mask with respect to the substrate may include confirming an alignment state of the substrate and the mask by using in real-time alignment confirmation members through second holes in the support unit.

Forming the organic light emitting element on the substrate may include forming a first electrode, an intermediate layer having an organic light-emitting layer, a second electrode, and an encapsulating layer on the substrate, at least the encapsulating layer being the thin film of the organic light emitting element.

Forming the thin film of the organic light emitting element may include forming an insulating layer.

Forming the thin film of the organic light emitting element may include forming a conductive film.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
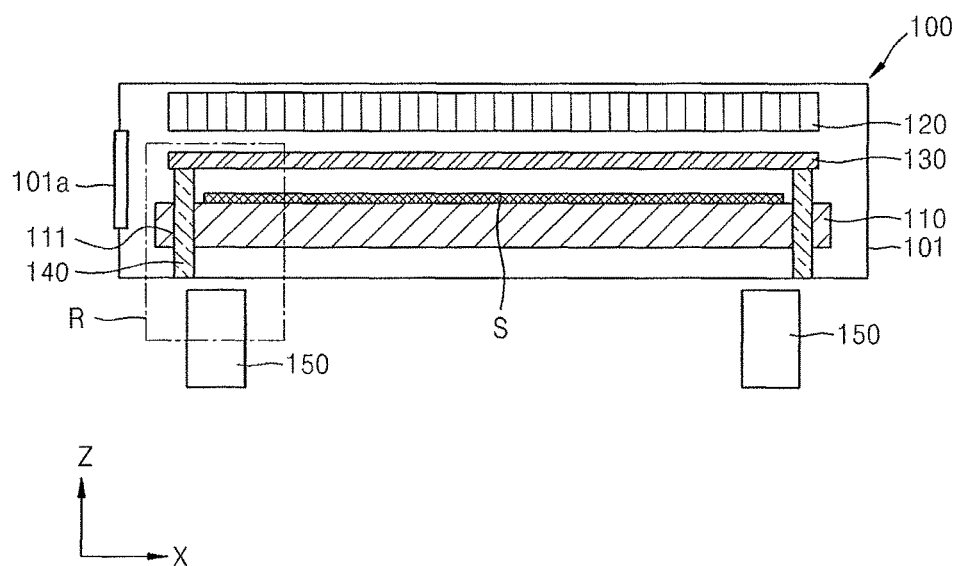
FIG. 1 illustrates a schematic view of a deposition apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, the example embodiments will be described more fully with reference to the accompanying drawings, in which exemplary embodiments of the example embodiments are shown.

Figure 2:
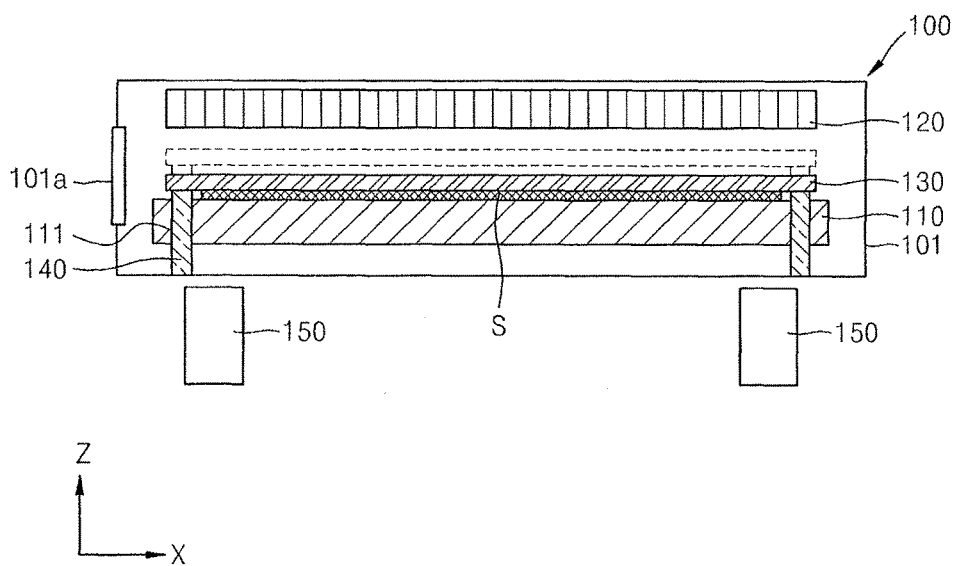
FIG. 2 illustrates a view of a mask and a substrate aligned by using alignment units of the deposition apparatus of FIG. 1.

FIG. 1 is schematic drawing of a deposition apparatus 100 according to an embodiment. FIG. 2 is a view of a mask 130 and a substrate S aligned by using alignment units 140 of the deposition apparatus 100.

Referring to FIGS. 1 and 2, the deposition apparatus 100 may include a chamber 101, a support unit 110, a supply unit 120, the alignment units 140, and alignment confirmation members 150.

The chamber 101 may be connected to a pump (not shown) to control atmospheric pressure during a deposition process, and may accommodate and protect the substrate S, the support unit 110, and the supply unit 120. Also, the chamber 101 may include at least one doorway 101a through which the substrate S or the mask 130 may move in and out.

The substrate S for the deposition process is disposed on the support unit 110. The support unit 110 enables the substrate S to be immovable or unshakable during the deposition process, which is performed on the substrate S. In this regard, the support unit 110 may include a clamp (not shown). Also, the support unit 110 may include one or more adsorption holes (not shown) for adsorption between the support unit 110 and the substrate S. The support unit 110 includes first holes 111 and second holes 112, which will be described in mote detail below.

The alignment units 140 are placed to penetrate the first holes 111 of the support unit 110. The alignment units 140, e.g., linear members, are formed as to be movable while supporting a lower surface of the mask 130. In particular, the alignment units 140 may move along the Z-axis, as shown in FIG. 2. Also, the alignment units 140 may move in a direction of X-axis and a direction perpendicular to the X-axis of FIGS. 1 and 2 (the details will be described later). The alignment units 140 are disposed outside of the substrate S, e.g., each of the alignment units 140 may be horizontally spaced apart from an adjacent edge of the substrate S as to least not overlap the substrate S along a vertical direction.

The mask 130 has an opening unit (not shown) corresponding to a deposition pattern, i.e., a pattern to be formed on the substrate S. Also, the mask 130 may be an open mask. During the deposition process, the mask 130 and the substrate S may be positioned in close proximity to each other, as shown in FIG. 2.

The supply unit 120 is disposed opposite to the substrate S so as to supply one or more raw materials, i.e., a deposition material, in a direction toward the substrate S to advance the deposition process with respect to the substrate S. That is, the supply unit 120 is placed above the support unit 110 to overlap the substrate S. For example, the supply unit 120 may be a showerhead type that supplies one or more gases in a direction toward the substrate S.

In addition, a voltage may be applied between the supply unit 120 and the support unit 110 to transform the raw material, which is supplied as a gas phase from the supply unit 120 in a direction toward the substrate S, to a plasma phase. That is, the deposition apparatus 100 may be a plasma enhanced chemical vapor deposition (PECVD) apparatus. For example, voltage may be applied to each of the supply unit 120 and the support unit 110. However, the example embodiments are not limited thereto, and a separate electrode (not shown) may be disposed in the deposition apparatus 100 to generate plasma between the supply unit 120 and the support unit 110.

A size of the supply unit 120 is not limited, as long as the supply unit 120 may be formed to have a larger area than the substrate S, e.g., an area of a surface of the supply unit 120 facing the substrate S may be larger than an area of a surface of the substrate S facing the supply unit 120. Therefore, a deposition layer that is uniform throughout an entire surface of the substrate S may be formed.

Figure 3:
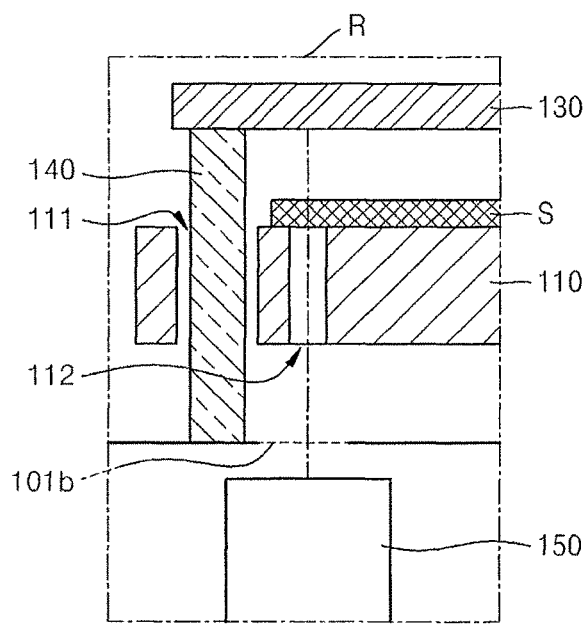
FIG. 3 illustrates a magnified view of a portion R of FIG. 1.
Figure 4:
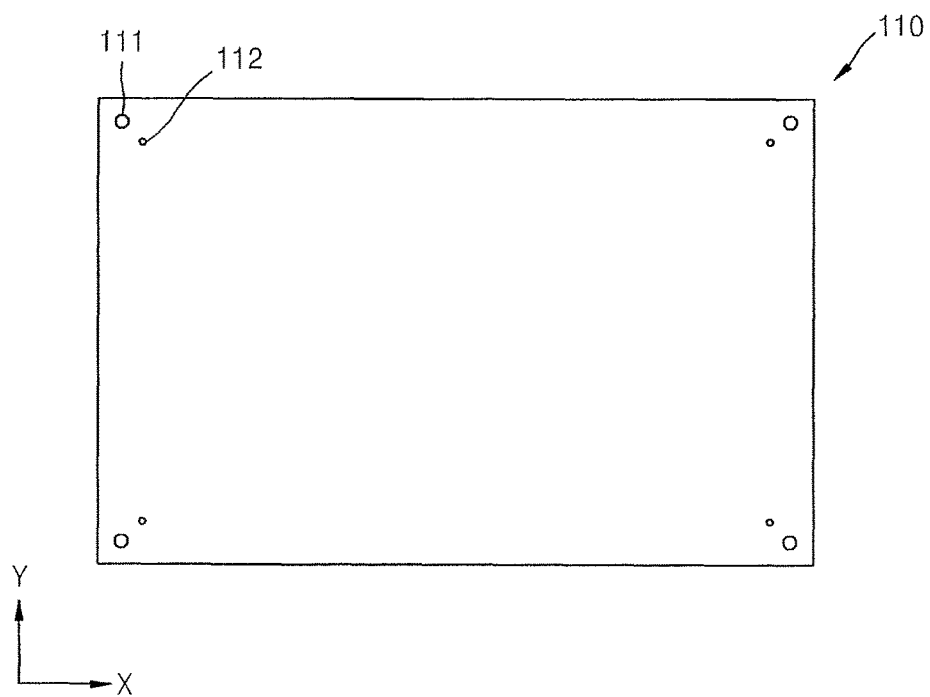
FIG. 4 illustrates a plan view of a support unit of FIG. 1 in detail.
Figure 5:
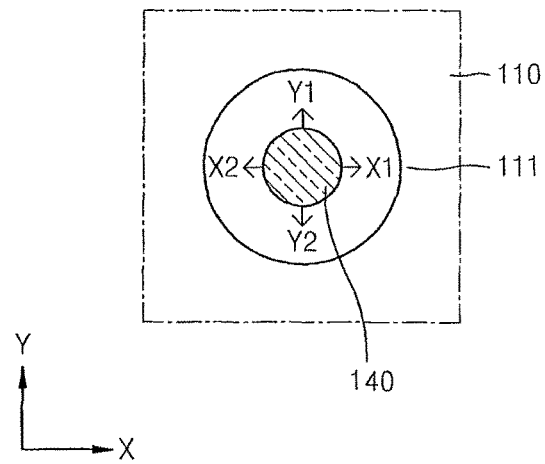
FIG. 5 illustrates a plan view of one of first holes of the support unit of FIG. 4 in detail.

FIG. 3 is a magnified view of a portion R of FIG. 1. FIG. 4 is a plan view of the support unit 110 of FIG. 1 in detail. FIG. 5 is a detailed plan view of one of the first holes 111 of the support unit 110 of FIG. 4.

Referring to FIGS. 3 through 5, the support unit 110 includes the first holes 111 and the second holes 112.

Each of the alignment units 140 is placed to penetrate through one of the first holes 111. That is, a number of the first holes 111 corresponds to a number of the alignment units 140. For example, as shown in FIG. 4, the first holes 111 may be positioned at, e.g., adjacent to, four corners of the support unit 110, and the alignment units 140 may be disposed to penetrate through the four first holes 111, as shown in FIG. 3. That is, the number of the alignment units 140 and the number of the first holes 111 may be the same.

In addition, the first holes 111 are formed larger than at least a cross-sectional area of the alignment units 140. That is, as shown in FIG. 5, a diameter of the each first hole 111 may be larger than a diameter of a cross section of a corresponding alignment unit 140, e.g., a space may be defined between an outer sidewall of the alignment unit and an inner wall of a corresponding first hole 111 (FIG. 3). Therefore, the alignment units 140 may move through the first holes 111. That is, as shown in FIG. 2, the alignment units 140 may move vertically (along the Z-axis of FIG. 2) through the first holes 111, and as shown in FIG. 5, the alignment units 140 may also move parallel to the X-Y plane within the first holes 111, i.e., along either of directions X1, X2, Y1, and Y2 of FIG. 5.

The alignment units 140 are in contact with a lower surface of the mask 130 to support the mask 130. The alignment unit 140 may move along the X, Y, or Z-axis, i.e., in 3-dimensions, while supporting the mask 130. Therefore, the mask 130, being supported by the alignment units 140, may also move along the X, Y, or Z-axis by the movement of the alignment units 140.

The second holes 112 are positioned to overlap, e.g., correspond with, the substrate S. For example, as illustrated in FIG. 3, the substrate S may cover the second holes 112. The second holes 112 may be positioned closer to a center region of the support unit 110 than the first holes 111. For example, as illustrated in FIG. 4, each second hole 112 may be between a center of the support unit 110 and a corresponding first hole 11 to form a diagonal line through the center of the support unit.

The alignment confirmation members 150 are placed under the chamber 101 to overlap, e.g., correspond with, the second holes 112. Also, the alignment confirmation members 150 are positioned not to move outside of the support unit 110, e.g., the support unit 110 may be positioned to completely cover and overlap upper surfaces of alignment confirmation members 150. Therefore, the alignment confirmation members 150 may be prevented from being contaminated by the raw material, which is sprayed from the supply unit 120, and thus accurate confirmation ability of the alignment confirmation members 150 may be maintained.

The alignment confirmation members 150 may confirm an alignment state of the substrate S and the mask 130 through the second holes 112 of the support unit 110. The alignment confirmation members 150 may be, e.g., a camera. Transparent windows 101b may be formed at areas overlapping, e.g., corresponding to, the second holes 112 at a lower part of the chamber 101 to ease the confirming performance of the alignment confirmation members 150. For example, the alignment confirmation members 150 may be on an optical axis with the substrate S through the transparent window 101b and the second hole 112 (dashed line in FIG. 3). Also, although not shown, an alignment mark (not shown) is formed in each of the substrate S and the mask 130, and thus the alignment confirmation members 150 may confirm an alignment state of the substrate S and the mask 130 by checking the alignment mark of each of the substrate S and the mask 130.

Hereinafter, the operation of the deposition apparatus 100 according to an embodiment will be briefly described.

The substrate S is inserted into the chamber 101 of the deposition apparatus 100 and disposed on the support unit 110. Also, the mask 130 is inserted into the chamber 101 and disposed on the alignment units 140 to be supported by the alignment units 140.

The alignment units 140 align the mask 130 with respect to the substrate S while moving in a planar motion parallel to the substrate S. That is, the alignment units 140 perform an aligning task while moving along the X-axis or Y-axis in the first holes 111 of the support unit 110. Here, the alignment confirmation members 150 confirm the alignment mark (not shown) of the mask 130 and the alignment mark (not shown) of the substrate S in real-time. In this regard, the alignment units 140 may easily align the mask 130 with respect to the substrate S.

After performing the aligning task on the X-Y plane, the alignment units 140 move along the Z-axis. That is, as shown in FIG. 2, the alignment units 140 move down toward the substrate S and position the mask 130 and the substrate S in close proximity. After the aligning task, the desired raw material is provided from the supply unit 120, and thus a deposition layer of a desired pattern may be easily formed on the substrate S.

Figure 6A:
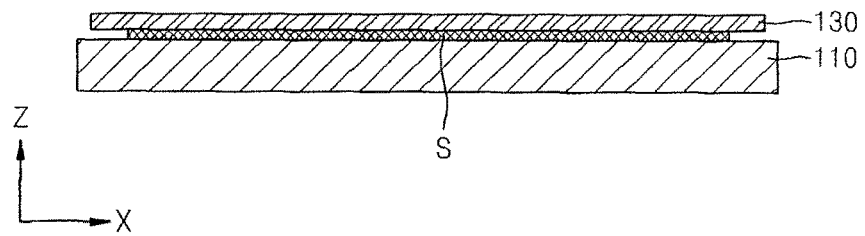
FIG. 6A illustrates a cross-sectional view of the support unit of FIG. 1.
Figure 6B:
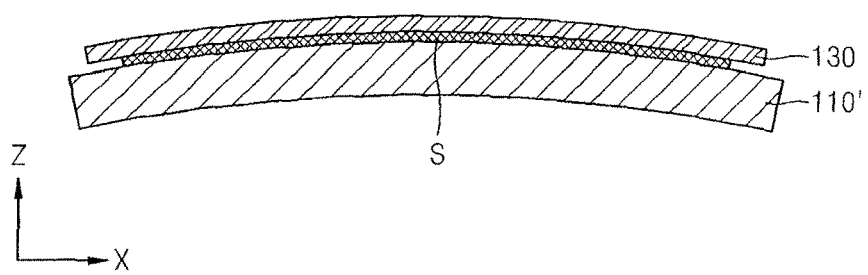
FIGS. 6B and 6C illustrate modified examples of the support unit of FIG. 1.
Figure 6C:
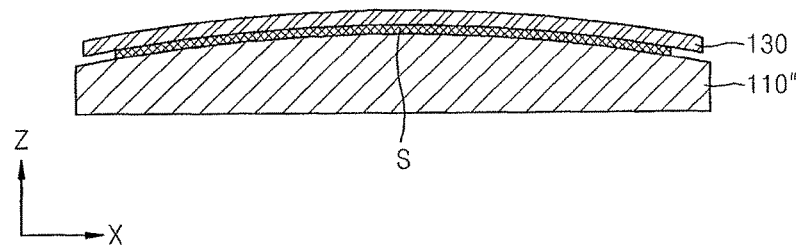

FIG. 6A is a cross-sectional view of the support unit 110 of FIG. 1. FIGS. 6B and 6C are modified examples of support units 110' and 110". For convenience in description, other elements than the support units 110, 110', or 110", the substrate S, and the mask 130 are omitted.

As shown in FIG. 6A, for example, the support unit 110 may have a flat upper surface. The substrate S and the mask 130 are disposed on the flat upper surface of the support unit 110.

Also, as shown in FIG. 6B, the support unit 110' may have a curved upper surface. In particular, a center region may protrude upward compared to end regions of the upper surface of the support unit 110'. Moreover, a lower surface of the support unit 110' may also be curved to correspond to the upper surface of the support unit 110'. Because of such a curve of the support unit 110', the substrate S may also have a curve corresponding to the upper surface of the support unit 110' when the substrate S is disposed on the support unit 110'. Thus, the substrate S and the support unit 110' may be effectively adhered to each other. When the substrate S and the support unit 110' are adhered to each other, contamination of the lower surface of the substrate S and the upper surface of the support unit 110' by the raw material sprayed from the supply unit 120 may be effectively prevented. Also, the mask 130 may also be curved to correspond to the substrate S, so the substrate S and the mask 130 may be effectively adhered to each other, thereby facilitating a precise control of deposition layer of a desired pattern on the substrate S.

A degree of the curve may vary, but a distance between the most protruding portion of the center region of the upper surface of the support unit 110' and the end regions of the upper surface of the support unit 110' is about 1 mm or less. That is, when the upper surface of the support unit 110' is curved too much, the substrate S may curve too much, thereby causing a deposition layer thereon to be degraded during the deposition process. Particularly, when an inorganic deposition layer is formed on the substrate S, defects, e.g., cracks or the like, may occur, so the degree of the curve needs to be controlled as described above.

In addition, as shown in FIG. 6C, an upper surface of the support unit 110" may be curved while a lower surface of the support unit 110" may be flat. In this regard, stable positioning of the support unit 110" may be easily performed in the chamber 101.

According to the deposition apparatus 100 of the current embodiment, the substrate S is disposed on the upper surface of the support unit 110, and the supply unit 120 is disposed above the support unit 110 and opposite to the substrate S. Also, the mask 130 may be disposed on the upper surface of the substrate S to form a deposition layer of a desired pattern. The mask 130 may be easily aligned with the substrate S by using the alignment units 140. Particularly, the mask 130 and the substrate S may be aligned without an influence of the supply unit 120 by moving the alignment units 140, which penetrate through the first holes 111 of the support unit 110 to contact the mask 130, in three dimensions to align the mask 130 with the substrate S.

Further, the alignment confirmation members 150 are arranged under the support unit 110 may examine and confirm the alignment state of the substrate S and the mask 130 through the second holes 112 of the support unit 110 in real-time, so the alignment task of the substrate S and the mask 130 may be efficiently performed. In particular, the alignment confirmation members 150 may be disposed opposite to the supply unit 120, with the support unit 110 therebetween. That is, the supply unit 120 is disposed above the support unit 110, and the alignment confirmation members 150 are disposed below the support unit 110. Thus, the alignment confirmation members 150 may be shielded from the supply unit 120, thereby contamination caused by the deposition raw materials sprayed from the supply unit 120 may be prevented or substantially minimized with respect to the alignment confirmation members 150.

Also, when the support unit 110' or 110" with the curved upper surface is used, the substrate S and the mask 130 may be easily adhered to each other. Therefore, formation of a precise pattern for a deposition layer on the substrate S may be provided.

Figure 7:
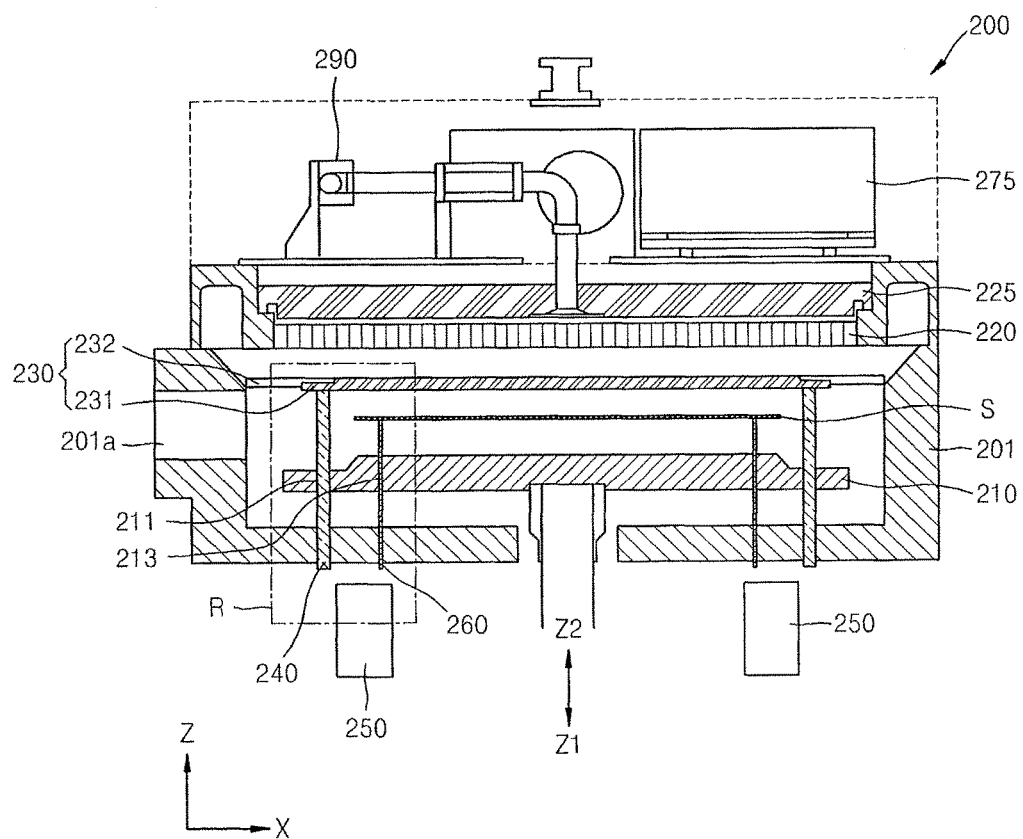
FIG. 7 illustrates a schematic view of a deposition apparatus according to another embodiment.
Figure 8:
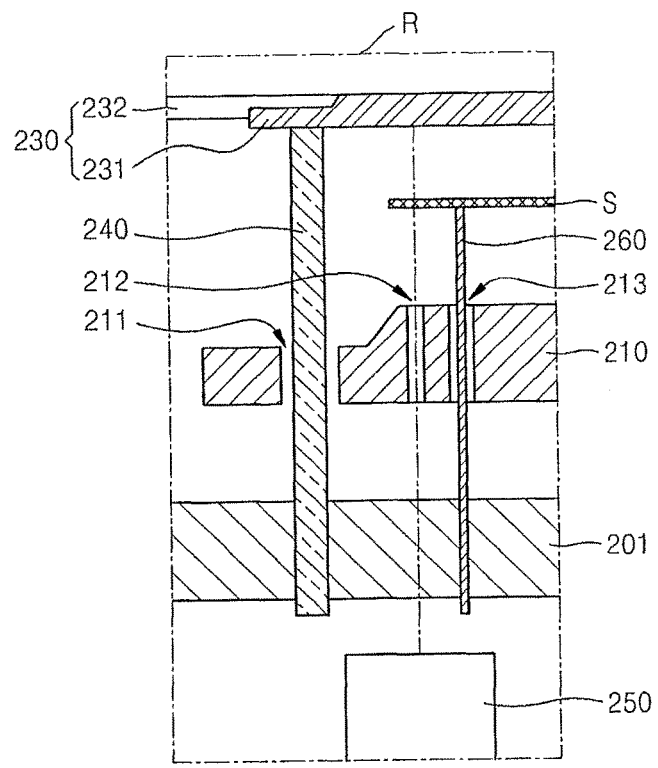
FIG. 8 illustrates a magnified view of a portion R of FIG. 7.
Figure 9:
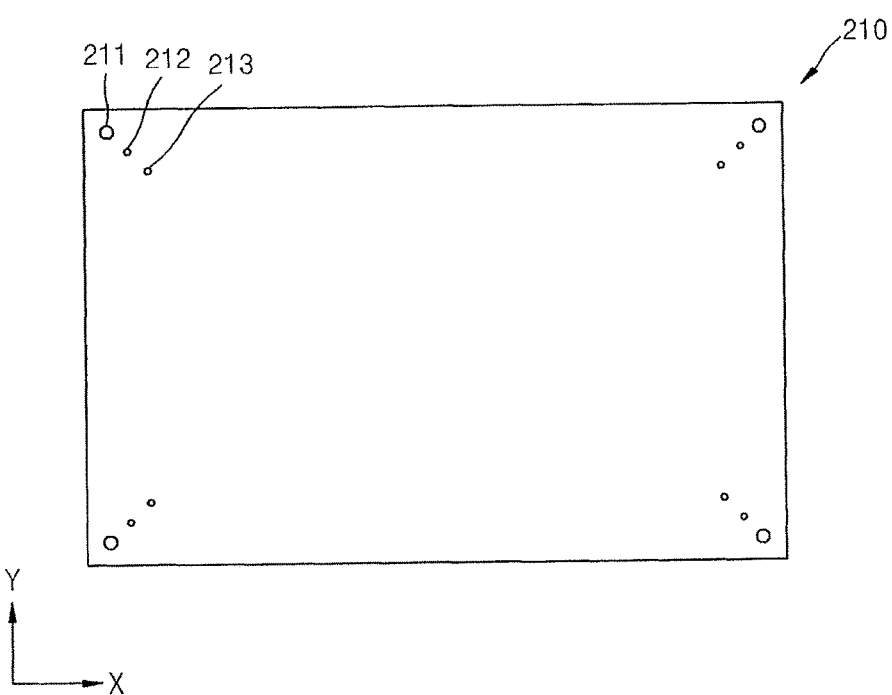
FIG. 9 illustrates a plan view of the support unit 210 of FIG. 7 in detail.

FIG. 7 is a schematic view of a deposition apparatus 200 according to another embodiment. FIG. 8 is a magnified view of a portion R of FIG. 7. FIG. 9 is a detailed plan view of the support unit 210 of FIG. 7.

Referring to FIGS. 7 and 8, the deposition apparatus 200 may include a chamber 201, a support unit 210, a supply unit 220, alignment units 240, alignment confirmation members 250, a power unit 275, lift pins 260, a base plate 225, and a cleaning unit 290.

The chamber 201 may be connected to a pump (not shown) to control atmospheric pressure during a deposition process, and may accommodate and protect the substrate S, the support unit 210, and the supply unit 220. Also, the chamber 201 may include at least one doorway 201a through which the substrate S or a mask 230 may move in and out.

The substrate S for the deposition process is disposed on the support unit 210. In particular, when the substrate S is inserted into the chamber 201 through the doorway 201a of the chamber 201, the substrate is disposed on the lift pins 260. The lift pins 260 may move vertically, i.e., along the Z-axis of FIG. 7, thus the lift pins 260 having the substrate S thereon move down in a direction toward the support unit 210 to place the substrate S on the support unit 210. The lift pins 260 are disposed to penetrate through third holes 213 of the support unit 210. The lift pins 260 move in a vertical direction passing through the third holes 213.

The support unit 210 enables the substrate S to be immovable or unshakable during the deposition process, which is performed on the substrate S. In this regard, the support unit 210 may include a clamp (not shown). Also, the support unit 210 may include adsorption holes (not shown) for adsorption between the support unit 210 and the substrate S. The support unit 210 includes first holes 211, second holes 212, and the third holes 213. Moreover, the support unit 210 is formed to move vertically. That is, the support unit 210 moves in a direction of Z1 or Z2 as shown in FIG. 7. In this regard, a space between the substrate S and the supply unit 220 may be controlled after the substrate S is disposed on the support unit 210, and thus deposition conditions, particularly plasma generating conditions, may be varied.

The alignment units 240 are placed to penetrate the first holes 211 of the support unit 210. The alignment units 240 are formed as to be movable while supporting a lower surface of the mask 230. In particular, the alignment unit 240 may move along the X, Y, or Z-axis while supporting the mask 130 in the same manner described in the previous embodiment. The alignment units 240 are disposed outside of the substrate S, at least not to overlap the substrate S.

The mask 230 includes a mask body 231 and a mask frame 232. The mask body 231 has an opening unit (not shown) corresponding to a deposition pattern, which will be formed on the substrate S. Here, the mask body 231 may have a plurality of patterned opening units. In another embodiment, the mask 230 may be an open mask, and particularly the mask body 231 may have one opening unit of an extended type without a separate pattern. During the deposition process, the mask 230 and the substrate S may be positioned in close proximity to each other.

The supply unit 220 is disposed opposite to the substrate S so as to supply one or more raw materials in a direction toward the substrate S to proceed with the deposition process with respect to the substrate S. That is, the supply unit 220 is placed above the support unit 210. For example, the supply unit 220 may be a showerhead that supplies one or more gases in a direction toward the substrate S. Also, the supply unit 220 may be formed to uniformly supply the raw material onto the entire surface of the substrate S, and may be a diffuser type.

The base plate 225 may be disposed above the supply unit 220. That is, the base plate 225 may be disposed farther from the substrate S than the supply unit 220. The base plate 225 supports the supply unit 220.

In addition, a voltage may be applied between the supply unit 220 and the support unit 210 to transform the raw material, which is supplied as a gas phase from the supply unit 220 in a direction toward the substrate S, to a plasma phase. For example, a voltage may be applied to each of the supply unit 220 and the support unit 210. In another example, a voltage may be applied to the base plate 225. Moreover, when a voltage is applied, a ground voltage may be applied to one side.

The power unit 275 provides a voltage for transforming the raw material, which is supplied as a gas phase from the supply unit 220 in a direction toward the substrate S, to a plasma phase. The power unit 275 may provide various types of voltages, e.g., radio frequency (RF) voltage. The power unit 275 may be disposed outside of the chamber 201. However, the example embodiments are not limited thereto, and a separate electrode (not shown) may be disposed in the deposition apparatus 200 to generate plasma between the supply unit 220 and the support unit 210.

A size of the supply unit 220 is not limited, as long as the supply unit 220 may be formed to have a larger area than the substrate S. Therefore, a deposition layer that is uniform throughout an entire surface of the substrate S may be formed.

The cleaning unit 290 may be disposed as to be connected with the chamber 201. The cleaning unit 290 cleans the chamber 201 when the chamber 201 is contaminated as the deposition process is performed. The cleaning unit 290 may generate and provide a remote plasma into the chamber 201 to clean the chamber 201. For example, as the cleaning unit 290 is supplied with a $NF_3$ gas, the gas is transformed into a plasma phase, and the plasma is inserted to the chamber 201 so as the plasma may be in contact with layers formed on inner walls of the chamber 201, and thus the inner walls of the chamber 201 may be cleansed.

The alignment units 240, the support unit 210, and the like will be described in detail.

One of the alignment units 240 is placed to penetrate through one of the first holes 211. That is, a number of the first holes 211 corresponds to a number of the alignment units 240. For example, as shown in FIG. 9, the first holes 211 may be positioned adjacent to four corners of the support unit 210, and although not shown, the alignment units 240 may also be disposed to penetrate through the four first holes 211. In addition, the first holes 211 are formed larger than at least a cross-sectional area of the alignment units 240. Therefore, the alignment units 240 may move through the first holes 211.

The alignment units 240 are in contact with the lower surface of the mask 230 to support the mask 230. The alignment unit 240 may move along the X, Y, or Z-axis, i.e., in 3-dimensions, while supporting the mask 230. Therefore, the mask 230 being supported by the alignment units 240 may also move along the X, Y, or Z-axis by the movement of the alignment units 240.

The second holes 212 are positioned to correspond with the substrate S. The second holes 212 may be positioned closer to a center region of the support unit 210 than the first holes 211.

The alignment confirmation members 250 are placed under the chamber 201 to correspond with the second holes 212. Also, the alignment confirmation members 250 are positioned not to move outside of the support unit 210. Therefore, the alignment confirmation members 250 may be prevented from being contaminated by the raw material, which is sprayed from the supply unit 220, and thus accurate confirmation ability of the alignment confirmation members 250 may be maintained.

The alignment confirmation members 250 may confirm an alignment state of the substrate S and the mask 230 through the second holes 212 of the support unit 210. The alignment confirmation members 250 may be, e.g., a camera. Transparent windows (not shown) may be formed at areas corresponding to the second holes 212 at a lower part of the chamber 201 to ease the confirming performance of the alignment confirmation members 250. Also, although not shown, an alignment mark (not shown) is formed in each of the substrate S and the mask 230, and thus the alignment confirmation members 250 confirm an alignment state of the substrate S and the mask 230 by checking the alignment mark of each of the substrate S and the mask 230.

The third holes 213 are positioned closer to a center region of the support unit 210 than the first holes 211 and the second holes 212. The lift pins 260 are placed to penetrate through the third holes 213 and a size of the third holes 213 may be formed larger than a cross-sectional area of the lift pins 260. Therefore, the lift pins 260 may easily move vertically through the third holes 213, i.e., without contacting the sidewalls of the third holes 213.

Hereinafter, the operation of the deposition apparatus 200 according to another embodiment will be briefly described.

When the substrate S is inserted into the chamber 201 of the deposition apparatus 200, the substrate S is supported by the lift pins 260 disposed so as to penetrate through the third holes 213 of the support unit 210. The lift pins 260 move down while supporting the substrate S toward the support unit 210 and dispose the substrate S on the upper surface of the support unit 210. In order to allow for the vertical movement of the lift pins 260, the lift pins 260 may be disposed in the chamber 201, or as shown in FIGS. 7 and 8, certain areas of the lift pins 260 may be disposed penetrating through the chamber 201.

Also, the mask 230 is inserted into the chamber 201 and disposed on the alignment units 240 to be supported by the alignment units 240. The alignment units 240 align the mask 230 with respect to the substrate S, while moving in a planar motion parallel to the substrate S. That is, the alignment units 240 perform an aligning task while moving along the X-axis or Y-axis in the first holes 211 of the support unit 210. Here, the alignment confirmation members 250 confirm the alignment mark (not shown) of the mask 230 and the alignment mark (not shown) of the substrate S in real-time. In this regard, the alignment units 240 may easily align the mask 230 with respect to the substrate S.

After performing the aligning task on the X-Y plane, the alignment units 240 move along the Z-axis toward the support unit 210. That is, the alignment units 240 move down toward the support unit 210 and position the mask 230 and the substrate S in close proximity. After the aligning task, the desired raw material is provided from the supply unit 220, and thus a deposition layer of a desired pattern may be easily formed on the substrate S. Here, to increase efficiency of a raw material supply, a distance between the supply unit 220 and the substrate S may be controlled by the vertical movement of the support unit 210.

As described above, a plasma may be generated for the deposition process.

Although not shown, the support unit 210 of the current embodiment may also have a flat surface or a curved surface, as described with reference to FIGS. 6A through 6C.

According to the deposition apparatus 200 of the current embodiment, the substrate S is disposed on the upper surface of the support unit 210, and the supply unit 220 is disposed above the support unit 210 and opposite to the substrate S. Also, the mask 230 may be disposed on the upper surface of the substrate S to form a deposition layer of a desired pattern. The mask 230 may be easily aligned with the substrate S by using the alignment units 240. Particularly, the mask 230 and the substrate S may be aligned without an influence of the supply unit 220 by moving the alignment units 240 in the first holes 211 of the support unit 210. Further, as the alignment confirmation members 250 are arranged under the support unit 210, and the alignment confirmation members 250 advance the alignment task by confirming the alignment state of the substrate S and the mask 230 through the second holes 212 of the support unit 210 in real-time, the alignment task of the substrate S and the mask 230 may be efficiently performed.

In particular, the alignment confirmation members 250 may be disposed opposite to the supply unit 220 with the support unit 210 therebetween. That is, the support unit 220 is disposed above the support unit 210, and the alignment confirmation members 250 are disposed under the support unit 210. Thus, the alignment confirmation members 250 prevent contamination caused by the deposition raw materials being sprayed from the supply unit 220.

Also, when the substrate S is disposed on the support unit 210, the substrate S is placed by using the lift pins 260 penetrating through the third holes 213 of the support unit 210. Thus, the substrate S may be immovably or unshakably disposed on the support unit 210 at a desired location. Particularly, the third holes 213 may be positioned closer to the center region of the support unit 210 than the first holes 211 and the second holes 212 so as the lift pins 260 do not influence the aligning task of the mask 230. In addition, if the upper surface of the support unit 210 is curved, the substrate S and the mask 230 may be adhered to each other, and thus a precise pattern may be formed on a deposition layer of the substrate S.

Figure 10:
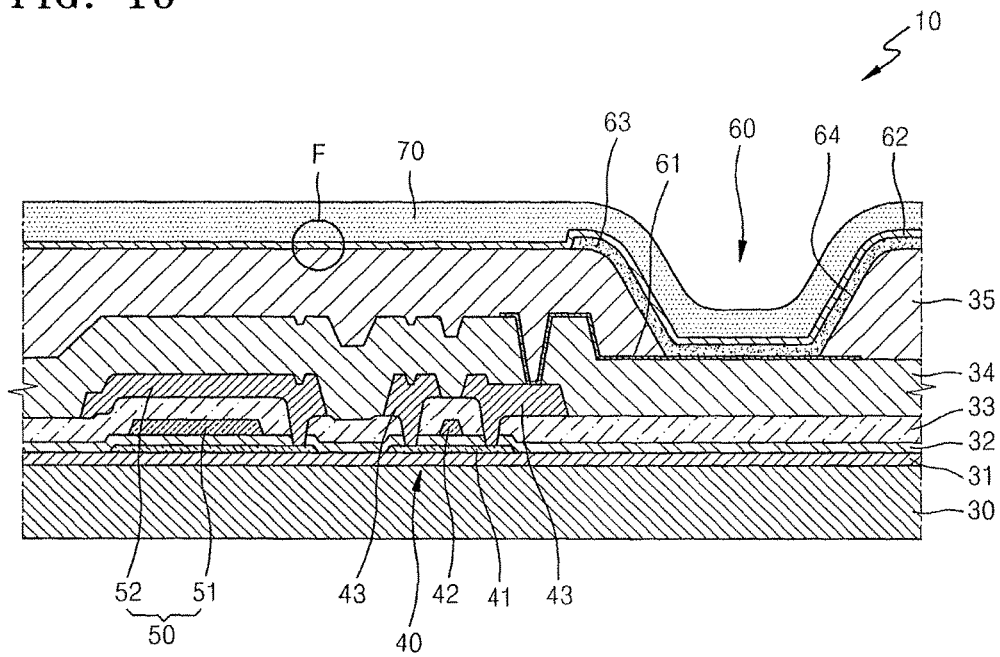
FIG. 10 illustrates a schematic cross-sectional view of an organic light-emitting display apparatus manufactured using a deposition apparatus according to an embodiment.
Figure 11:
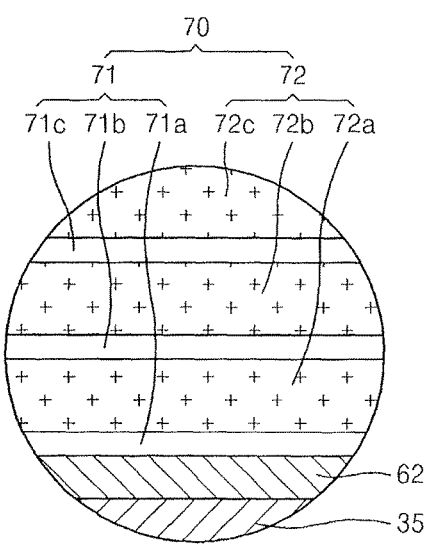
FIG. 11 illustrates a magnified view of a portion F of FIG. 10.

FIG. 10 is a schematic cross-sectional view of an organic light-emitting display apparatus 10 manufactured using any one of the deposition apparatuses 100 and 200 according to an embodiment. FIG. 11 is a magnified view of a portion F of FIG. 10.

Referring to FIGS. 10 and 11, the organic light-emitting display apparatus 10 may include a substrate 30. The substrate 30 may be formed of, e.g., a glass material, a plastic material, or a metal. A buffer layer 31 may be formed on the substrate 30 to provide a planarized surface and to prevent moisture and foreign materials from penetrating towards the substrate 30.

A thin film transistor (TFT) 40, a capacitor 50, and an organic light-emitting device 60 may be formed on the buffer layer 31. The TFT 40 may include an active layer 41, a gate electrode 42, and source/drain electrodes 43. The organic light-emitting device 60 may include a first electrode 61, a second electrode 62, and an intermediate layer 63. The capacitor 50 may include a first capacitor electrode 51 and a second capacitor electrode 52.

More specifically, the active layer 41 formed to a predetermined pattern may be disposed on an upper surface of the buffer layer 31. The active layer 41 may include an inorganic semiconductor material, e.g., silicon, an organic semiconductor material, or an oxide semiconductor material, and may be formed by optionally doping a p-type dopant or an n-type dopant.

A gate insulating film 32 may be formed on the active layer 41. The gate electrode 42 may be formed on the gate insulating film 32 to correspond to the active layer 41. The first capacitor electrode 51 may be formed on the gate insulating film 32 by using the same material used to form the gate electrode 42.

An interlayer insulating layer 33 covering the gate electrode 42 may be formed, and the source/drain electrodes 43 may be formed to contact predetermined regions of the active layer 41 on the interlayer insulating layer 33. The second capacitor electrode 52 may be formed on the interlayer insulating layer 33 by using the same material used to form the source/drain electrodes 43.

A passivation layer 34 covering the source/drain electrodes 43 may be formed, and an additional insulating layer may be further formed on the passivation layer 34 to planarize the TFT 40.

The first electrode 61 may be formed on the passivation layer 34. The first electrode 61 may be formed to be electrically connected to one of the source/drain electrodes 43. Afterwards, a pixel defining film 35 covering the first electrode 61 may be formed. After forming a predetermined opening 64 in the pixel defining film 35, an intermediate layer 63 that includes an organic light-emitting layer may be formed in a region defined by the opening 64. The second electrode 62 may be formed on the intermediate layer 63.

An encapsulating layer 70 may be formed on the second electrode 62. The encapsulating layer 70 may contain an organic material or an inorganic material, and may have a structure in which the organic material and the inorganic material are alternately stacked. For example, the encapsulating layer 70 may be formed by using the deposition apparatus 100 or 200. That is, a desired layer may be formed by using the deposition apparatus 100 or 200, after inserting the substrate 30 on which the second electrode 62 is formed into the chamber 101 or 201.

In particular, the encapsulating layer 70 may include an inorganic layer 71 and an organic layer 72. The inorganic layer 71 may include a plurality of layers 71*a*, 71*b*, and 71*c*, and the organic layer 72 may include a plurality of layers 72*a*, 72*b*, and 72*c*. At this point, the layers 71*a*, 71*b*, and 71*c* of the inorganic layer 71 may be formed by using the deposition apparatus 100 or 200.

However, the example embodiments are not limited thereto. That is, the buffer layer 31, the gate insulating film 32, the interlayer insulating layer 33, the passivation layer 34, the pixel defining film 35, and other insulating layers may also be formed by using the deposition apparatus 100 or 200 according to the example embodiments. Also, the active layer 41, the gate electrode 42, the source/drain electrodes 43, the first electrode 61, the intermediate layer 63, the second electrode 62, and other various thin films may be formed by using the deposition apparatus 100 or 200 according to the example embodiments.

As described above, when the deposition apparatus 100 or 200 according to the example embodiments are used, the characteristics of the deposited films formed in the organic light-emitting display apparatus 10 is increased, e.g., the electrical characteristics and image quality characteristics are increased. Also, thin films included in liquid crystal display (LCD) apparatuses and thin films included in various display apparatuses besides the organic light-emitting display apparatus 10 may be formed by using the deposition apparatus 100 or 200 according to the example embodiments.

In contrast, when a conventional organic light-emitting display apparatus is increased in size and is expected to have high definition, it may be difficult to deposit a large thin film with a desired characteristic. Also, there may be a limit in increasing an efficiency of a process of forming the large thin film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the example embodiments as set forth in the following claims.

What is claimed is:

1. A deposition apparatus for performing a deposition process by using a mask with respect to a substrate, the deposition apparatus comprising:
    a deposition chamber including a transparent window at a lower part of the deposition chamber;
    a stationary support unit in the chamber, the support unit including a top surface and first holes extending through the top surface of the support unit, the support unit being configured to support the substrate;
    a supply unit configured to supply at least one deposition raw material toward the substrate;
    movable alignment units that extend through the first holes of the support unit, the alignment units being configured to support the mask and being movable in three dimensions to align the mask with respect to the substrate, and
    alignment confirmation members below the lower part of the deposition chamber, the alignment confirmation members to confirm an alignment state of the substrate and the mask through the transparent window of the deposition chamber and second holes in the support unit.

2. The deposition apparatus as claimed in claim 1, wherein the alignment confirmation members are configured to check alignment of an alignment mark on the substrate and an alignment mark on the mask to confirm the alignment state of the substrate and the mask.

3. The deposition apparatus as claimed in claim 1, wherein the second holes in the support unit are closer to a center region of the support unit than the first holes.

4. The deposition apparatus as claimed in claim 1, wherein the alignment confirmation members are farther from the supply unit than the support unit.

5. The deposition apparatus as claimed in claim 1, wherein the support unit is between the alignment confirmation members and the supply unit.

6. The deposition apparatus as claimed in claim 1, wherein the chamber includes transparent windows overlapping the second holes, the alignment confirmation members being configured to confirm the alignment state of the substrate and the mask through the transparent windows.

7. The deposition apparatus as claimed in claim 1, wherein a cross-sectional area of the alignment units is smaller than a size of the first holes, the alignment units being movable in three dimensions inside the first holes.

8. The deposition apparatus as claimed in claim 1, wherein the alignment units are configured to move vertically and horizontally within the first hole while supporting the mask.

9. The deposition apparatus as claimed in claim 1, wherein an upper surface of the support unit is curved.

10. The deposition apparatus as claimed in claim 9, wherein a center region of the upper surface of the support unit protrudes upward relative to end regions of the upper surface of the support unit.

11. The deposition apparatus as claimed in claim 10, wherein a lower surface of the support unit is curved in accordance with a curvature of the upper surface of the support unit.

12. The deposition apparatus as claimed in claim 10, wherein a lower surface of the support unit is flat.

13. The deposition apparatus as claimed in claim 1, further comprising lift pins through third holes in the support unit, the lift pins being configured to support the substrate and to move vertically in the third holes to dispose the substrate onto the support unit.

14. The deposition apparatus as claimed in claim 13, wherein the third holes are closer to a center region of the support unit than the first holes.

15. The deposition apparatus as claimed in claim 1, further comprising a base plate configured to support the supply unit, the base plate being positioned farther from the support unit than the supply unit.

16. The deposition apparatus as claimed in claim 1, further comprising a power unit configured to apply voltage between the supply unit and the support unit to generate plasma.

17. The deposition apparatus as claimed in claim 1, further comprising a cleaning unit configured to generate plasma and to insert the plasma into the chamber to clean inside of the chamber.

18. The deposition apparatus as claimed in claim 1, wherein the support unit is movable along a normal thereto.

19. The deposition apparatus as claimed in claim 1, wherein the chamber includes at least one doorway, the substrate or the mask being inserted to the chamber through the at least one doorway.

* * * * *